United States Patent [19]

Leeb et al.

[11] Patent Number: 5,629,881
[45] Date of Patent: May 13, 1997

[54] METHOD FOR FILTERING A DIGITAL VALUE TRAIN WITH IMPROVED NOISE BEHAVIOR, AND CIRCUIT CONFIGURATION FOR PERFORMING THE METHOD

[75] Inventors: Ferenc Leeb, Villach, Austria; Lajos Gazsi, Düsseldorf, Germany

[73] Assignee: Siemens Aktiengesellschaft, Munich, Germany

[21] Appl. No.: 404,366

[22] Filed: Mar. 15, 1995

[30] Foreign Application Priority Data

Mar. 15, 1994 [DE] Germany ............................ 44 08 768.3

[51] Int. Cl.$^6$ ............................... G06F 17/10; G06F 7/38
[52] U.S. Cl. ............................... 364/724.17; 364/745
[58] Field of Search ............................... 364/724.17, 745

[56] References Cited

U.S. PATENT DOCUMENTS

| | | | |
|---|---|---|---|
| 4,727,506 | 2/1988 | Fling | 364/745 |
| 4,755,961 | 7/1988 | Kuriki et al. | 364/745 |
| 4,809,207 | 2/1989 | Nillesen | 364/724.17 |
| 5,278,552 | 1/1994 | Ito | 364/724.17 |

OTHER PUBLICATIONS

Introduction to Digital Signal Processing (Proakes et al.) 1988, Macmillan Publishing, Chapter 10, pp. 739–794.

*Primary Examiner*—Tan V. Mai
*Attorney, Agent, or Firm*—Herbert L. Lerner; Laurence A. Greenberg

[57] ABSTRACT

A method and a circuit configuration for filtering a digital value with improved noise behavior include adding a digital input value and a feedback value to form a digital output value. The feedback value is equal to a first variable from which a second variable is subtracted, from which the second variable shifted m places to the right is subtracted, and to which the first variable is added. The first variable is equal to a bottom m bits of a previous digital output value and always represents a positive value. The second variable is equal to a previous first variable from which a previous second variable shifted arithmetically by m bits to the right is subtracted. The feedback value is calculated with at least one additional least significant bit until at least a last addition with the first variable. Subsequently, an expansion is no longer taken into account.

5 Claims, 1 Drawing Sheet

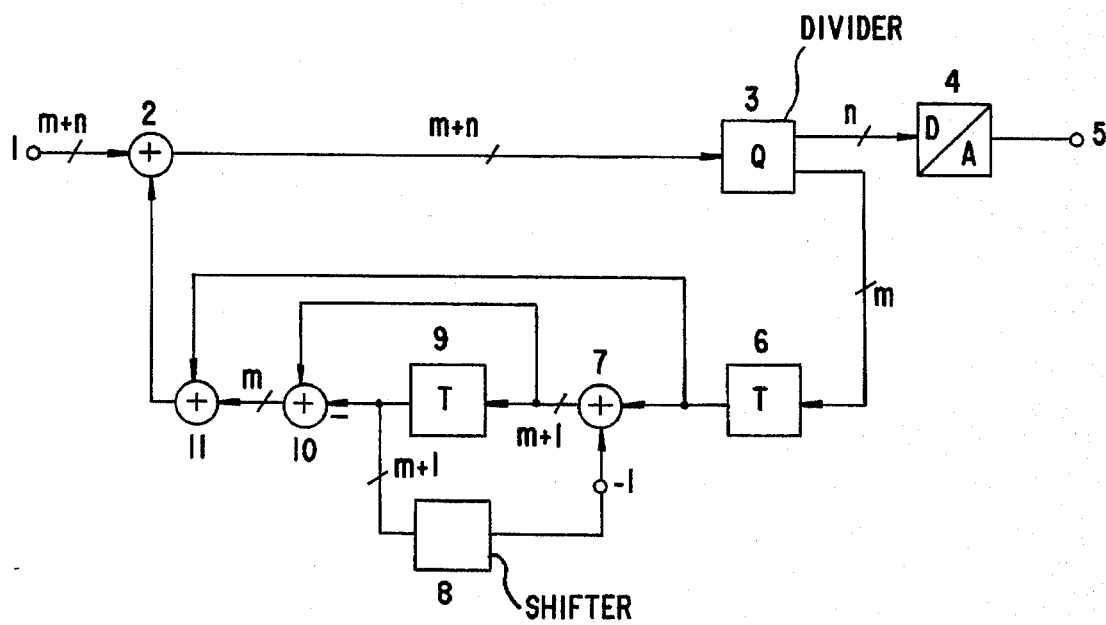

METHOD FOR FILTERING A DIGITAL VALUE TRAIN WITH IMPROVED NOISE BEHAVIOR, AND CIRCUIT CONFIGURATION FOR PERFORMING THE METHOD

BACKGROUND OF THE INVENTION

1. Field of the Invention

The invention relates to a method for filtering a digital value with improved noise behavior and a circuit configuration for carrying out the method.

One such method or configuration is known, for instance, from a paper entitled: "A 16-Bit 4th Order Noise-Shaping D/A Converter" by Carley and Kenney, in IEEE 1988 Custom Integrated Circuits Conference, pp. 21.7.1 ff. Such a system is especially shown in FIG. 1 on page 21.7.1.

In delta-sigma modulators, when digital zero values are input at the output of a digital/analog converter, a noise signal appears that has variously strongly pronounced harmonic components, which are created by a preceding noise-shaping filter that is used. The IEEE Journal of Solid-State Circuits, Vol. 23, No. 6, December 1988, pp. 1351 ff. and IEEE 1990 CH 2868-8/90/0000 pp. 895 ff. and the paper cited above all disclose various methods for improving the signal-to-noise ratio in such devices. However, those methods are relatively complicated and expensive.

Second order noise shapers of that kind, as a function of their internal condition (i.e., memory contents), produce limit cycles, as a result of which harmonic components are created, and can be reinforced, in the noise signal of a following D/A converter.

SUMMARY OF THE INVENTION

It is accordingly an object of the invention to provide a method for filtering a digital value train with improved noise behavior, and a circuit configuration for carrying out the method which is as simple as possible in structure and has high efficiency.

With the foregoing and other objects in view there is provided, in accordance with the invention, a method for filtering a digital value with improved noise behavior, which comprises adding a digital input value and a feedback value to form a digital output value; forming the feedback value from a first variable from which a second variable is subtracted, from which the second variable shifted m places to the right is subtracted, and to which the first variable is added; forming the first variable from a bottom m bits of a previous digital output value to always represent a positive value; forming the second variable from a previous first variable from which a previous second variable shifted arithmetically by m bits to the right is subtracted; calculating the feedback value with at least one additional least significant bit until at least a last addition with the first variable; and subsequently no longer taking an expansion into account.

In accordance with another mode of the invention, there is provided a method which comprises representing the bottom m bits as a positive number by means of an expansion by at least one additional most significant bit being set to zero.

With the objects of the invention in view, there is also provided a circuit configuration for filtering a digital value with improved noise behavior including a digital/analog converter; and a filter being connected upstream of the digital/analog converter and including a first adder stage having first and second inputs and an output, the first input of the first adder stage receiving m+n bits to be converted of a data word; a divider stage being connected to the output of the first adder stage and delivering a top n bits to the digital/analog converter; a first holding stage receiving a bottom m bits from the divider stage and having an output; a second adder stage having a first input being connected to the output of the first holding stage, having a second input and having an output; a third adder stage having a first input connected to the first input of the second adder stage, having a second input and having an output connected to the second input of the first adder stage; a second holding stage having an input being connected to the output of the second adder stage and having an output; a fourth adder stage having a first input connected to the input of the second holding stage, having a second input receiving a two's complement of an output signal of the second holding stage and having an output connected to the second input of the third adder stage; a two's complement former connected to the second input of the second adder stage; and a shift device having an input being connected to the output of the second holding stage and having an output being connected through the two's complement former to the second input of the second adder stage, the shift device shifting the data word present at its input to the right by m bits.

In accordance with another feature of the invention, at least the second and fourth adder stages, the second holding stage, and the shift device are expanded by at least one least significant bit.

In accordance with a concomitant feature of the invention, the first, second, third and fourth adder stages, the divider stage, the first and second holding stages, and the shift device are expanded by at least one least significant bit, and the at least one least significant bit is taken into account only in the second and fourth adder stages, the second holding stage, and the shift device.

Digital filtration of a value train according to the method of the invention has the advantage of not producing any limit cycles. In previous filters, those limit cycles caused the creation of harmonic components in the noise signal.

Other features which are considered as characteristic for the invention are set forth in the appended claims.

Although the invention is illustrated and described herein as embodied in a method for filtering a digital value train with improved noise behavior, and a circuit configuration for performing the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the single figure of the drawing.

BRIEF DESCRIPTION OF THE DRAWING

The figure of the drawing is a schematic and block circuit diagram of a circuit configuration for for filtering a digital value train with improved noise behavior, according to the invention.

DESCRIPTION OF THE PREFERRED EMBODIMENTS

Referring now to the single figure of the drawing in detail, it is seen that reference numeral 1 indicates a connecting terminal, which is connected to a first input of a first adder 2. A connecting bus between the connecting terminal 1 and the adder 2 may, by way of example, be m+n=16 bits wide. In that case, the connecting bus carries a 16-bit data word, for example. An output of the adder 2 is connected to an input of a divider 3 having an output at which n lines of the MSBs and m lines of the LSBs, for instance, of the data word are made available. The higher-significance n MSB lines may, for instance, be the top eight bits of a 16-bit data word and are delivered to a digital/analog converter 4. An output of the digital/analog converter 4 is connected to a connecting terminal 5. The lower-significance m LSB lines, for instance the bottom eight bits of a 16-bit data word, are supplied to a first time delay member or holding stage 6. This m-bit data word is considered in principle to be a positive number. This can be accomplished, for instance, by introducing one additional most significant bit, which is occupied by the value "0". An output of the time delay member 6 is connected to a first input of a second adder 7 and to a first input of a third adder 11. An output of the adder 7 is interconnected with a first input of a fourth adder 10 and with a second delay member or holding stage 9. An output signal of the delay member 9 is delivered to a shift unit or device 8, and a two's complement of the output signal is delivered to a second input of the adder 10. A two's complement former indicated by −1 forms a two's complement of an output signal of the shift unit 8 which is delivered to a second input of the adder 7. An output of the adder 10 is interconnected with a second input of the adder 11. An output of the adder 11 is connected to a second input of the adder 2. Both the adders 7 and 10, the time delay member 9 and the shift device 8 are expanded by at least one least significant bit, so that in this region at least m+1 bits are expected. Correspondingly required MSB bits are provided in the entire feedback region, so that no overflow occurs. The additional least significant bit is not taken into account beyond the adder 11. Naturally, the entire configuration may already provide this expansion by the least significant bit in all stages, but according to the invention this bit must no longer be taken into account no later than at the adder 2. Logically, it can then be taken into account no earlier than after the divider for the m bits.

The entire configuration can preferably be constructed as a signal processor. However, the configuration may also be hard-wired. The individual addition operations must logically be carried out with saturated and unsaturated adders as appropriate, as is known in detail in the prior art from digital filter circuits.

The noise-shaping filter shown in the figure operates by the following principle:

If an output value train at the output of the adder 2 is given as y(t), then it is true that:

$$y(t)=x(t)+a(t),$$

in which x(t) designates an input value train at the terminal 1 and a(t) designates a feedback value train at the second input of the adder 2.

The feedback value train a(t) is then:

$$a(t)=2 \cdot x_0(t)-x_1(t)-sh(m)[x_1(t)],$$

in which $x_0(t)$ is a variable stored in the delay member or memory 6, and $x_1(t)$ is a variable stored in the delay member or memory 9. The term $sh(m)[x_1(t)]$ is understood to be the arithmetic shift to the right (in the direction of the LSB) by m places of the variable $x_1(t)$ in the unit 8.

The value train $x_0(t)$ is defined as:

$$x_0(t)=Q_m[y(t-1)],$$

in which $Q_m[y(t-1)]$ designates the function of cutting off the bottom m bits of the value y(t−1), and $x_0(t)$ is always to be considered positive. The expansion by the additional LSB bit, for instance, as well as by at least one additional MSB bit, which are set to zero, can also be performed at this point.

The additional LSB bit can be taken into account no earlier than after the division of the output value y(t). According to the invention, this additional LSB bit is required only for the operation:

$$b(t)=x_0(t)-x_1(t)-sh(m)[x_1(t)],$$

in which connection the following applies:

$$a(t)=x_0(t)+b(t).$$

The additional MSB bit can likewise be generated no earlier than after the cutoff of the aforementioned addition value, in order to represent the small m bits as the positive number.

The value train $x_1(t)$ is defined as:

$$x_1(t)=x_0(t-1)-sh(m)[x_1(t-1)],$$

and the above comments again apply. For t, it can be said that t=0, 1, 2, ..., in which for t=0, the resultant value of $x_0(-1)$ and $x_1(-1)$ are the respective previously occupied values of the memory cells.

If digital values of a previously encoded speech signal are applied to the input terminal 1, for instance, then the entire configuration behaves like a normal noise-shaping filter, and the transmitted and coded speech signals can be picked up at the output terminal 5.

Conversely, if a continuously persisting digital "zero" signal is present at the input terminal 1, for instance during a pause in speaking, then the harmonic signal components in the noise that would otherwise conventionally be produced by the entire configuration because of limit cycles are greatly reduced by the provision of the shift unit 8. The shift unit 8 is provided in the feedback branch of the filter, which branch has been expanded by at least one least significant bit, and shifts the value at the output of the time delay member 9 to the right by m places, or accordingly in the example described above by seven places and carries it to the second input of the adder 7 as a two's complement so that this value is subtracted from the value present at the output of the time delay member 6. As a result of this provision, the harmonic components in the noise signal of the system that are created by the intrinsic dynamics of the fed-back filter system are greatly reduced. Measurements have demonstrated that these peaks within a noise signal can be virtually entirely eliminated by the configuration according to the invention.

No later than from the adder 7 on until the adder, n+q lines, for instance 12 bits, must be provided, in order to prevent overflow from the configuration or to furnish the additional MSB or LSB bits.

We claim:

1. A method for filtering a digital value with improved noise behavior, which comprises:

adding a digital input value and a feedback value to form a digital output value;

forming the feedback value from a first variable from which a second variable is subtracted, from which the second variable shifted m places to the right is subtracted, and to which the first variable is added;

forming the first variable from a bottom m bits of a previous digital output value to always represent a positive value;

forming the second variable from a previous first variable from which a previous second variable shifted arithmetically by m bits to the right is subtracted;

calculating the feedback value with at least one additional least significant bit until at least a last addition with the first variable; and subsequently no longer taking the least significant bit into account.

2. The method according to claim 1, which comprises representing the bottom m bits as a positive number by means of an expansion by at least one additional most significant bit being set to zero.

3. A circuit configuration for filtering a digital value with improved noise behavior, comprising:

a digital/analog converter; and a filter being connected upstream of said digital/analog converter and including:

a first adder stage having first and second inputs and an output, the first input of said first adder stage receiving m +n bits to be changed of a data word;

a divider stage being connected to the output of said first adder stage and delivering a top n bits to said digital/analog converter;

a first holding stage receiving a bottom m bits from said divider stage and having an output;

a second adder stage having a first input being connected to the output of said first holding stage, having a second input and having an output;

a third adder stage having a first input connected to the first input of said second adder stage, having a second input and having an output connected to the second input of said first adder stage;

a second holding stage having an input being connected to the output of said second adder stage and having an output;

a fourth adder stage having a first input connected to the input of said second holding stage, having a second input receiving a two's complement of an output signal of said second holding stage and having an output connected to the second input of said third adder stage;

a two's complement former connected to the second input of said second adder stage; and a shift device having an input being connected to the output of said second holding stage and having an output being connected through said two's complement former to the second input of said second adder stage, said shift device shifting the data word present at its input to the right by m bits.

4. The circuit configuration according to claim 3, wherein at least said second and fourth adder stages, said second holding stage, and said shift device are expanded by at least one least significant bit.

5. The circuit configuration according to claim 3, wherein said first, second, third and fourth adder stages, said divider stage, said first and second holding stages, and said shift device are expanded by at least one least significant bit, and the at least one least significant bit is taken into account only in said second and fourth adder stages, said second holding stage, and said shift device.

* * * * *